United States Patent
Chae et al.

(10) Patent No.: US 9,704,936 B2
(45) Date of Patent: Jul. 11, 2017

(54) ORGANIC LIGHT EMITTING DIODE DISPLAY AND MANUFACTURING METHOD THEREOF

(71) Applicant: Samsung Display Co., Ltd., Yongin-si, Gyeonggi-do (KR)

(72) Inventors: Seung-Yeon Chae, Hwaseong-si (KR); Sang Gun Choi, Suwon-si (KR); Tae Woon Cha, Seoul (KR)

(73) Assignee: Samsung Display Co., Ltd., Gyeonggi-Do (KR)

( * ) Notice: Subject to any disclaimer, the term of this patent is extended or adjusted under 35 U.S.C. 154(b) by 0 days.

(21) Appl. No.: 14/879,591

(22) Filed: Oct. 9, 2015

(65) Prior Publication Data
US 2016/0233277 A1    Aug. 11, 2016

(30) Foreign Application Priority Data
Feb. 9, 2015    (KR) .......................... 10-2015-0019675

(51) Int. Cl.
*H01L 27/32*    (2006.01)

(52) U.S. Cl.
CPC ...... *H01L 27/3262* (2013.01); *H01L 27/3218* (2013.01); *H01L 27/3248* (2013.01)

(58) Field of Classification Search
CPC ............. H01L 27/3262; H01L 27/3218; H01L 2227/323; H01L 27/3248
See application file for complete search history.

(56) References Cited

U.S. PATENT DOCUMENTS

| 2007/0015318 A1* | 1/2007 | Tanada | H01L 21/268 438/149 |
| 2010/0085342 A1* | 4/2010 | Choi | H01L 27/3216 345/211 |

FOREIGN PATENT DOCUMENTS

| KR | 10-2005-0029824 A | 3/2005 |
| KR | 10-2008-0054626 A | 6/2008 |
| KR | 10-2010-0047317 A | 5/2010 |
| KR | 10-2010-0053355 A | 5/2010 |
| KR | 10-2010-0122842 A | 11/2010 |
| KR | 10-2012-0134222 A | 12/2012 |

\* cited by examiner

*Primary Examiner* — Kyoung Lee
(74) *Attorney, Agent, or Firm* — Knobbe Martens Olson & Bear LLP (57) ABSTRACT

An organic light emitting diode (OLED) display device including: a substrate; first, second and third thin film transistors sequentially laminated over the substrate; a pixel definition layer formed over the substrate and defining a pixel area; and first, second and third organic light emitting diode elements formed over the substrate, sequentially laminated in the pixel area, and respectively connected to the first, second and third thin film transistors.

21 Claims, 8 Drawing Sheets

ORGANIC LIGHT EMITTING DIODE DISPLAY AND MANUFACTURING METHOD THEREOF

CROSS-REFERENCE TO RELATED APPLICATION

This application claims priority to and the benefit of Korean Patent Application No. 10-2015-0019675 filed in the Korean Intellectual Property Office on Feb. 9, 2015, the entire contents of which are incorporated herein by reference.

BACKGROUND (a) Field

The present disclosure relates to an organic light emitting diode (OLED) display and a manufacturing method thereof, and more particularly, to an OLED display that can provide high resolution, and a manufacturing method thereof.

(b) Discussion of the Related Technology

Currently, as generally known display devices, there are a liquid crystal display (LCD), a plasma display panel (PDP), an organic light emitting diode (OLED) display, a field effect display (FED), an electrophoretic display, and the like.

Particularly, the OLED display includes an array of pixels, each of which includes two electrodes and an organic emission layer interposed therebetween. Electrons injected from one electrode and holes injected from the other electrode are combined in the organic emission layer to generate excitons, and the generated excitons release energy to emit light.

The OLED display may have a reduced thickness and weight since it has a self-luminance characteristic and does not require an additional light source, unlike the LCD.

In addition, the OLED display is receiving attention as a next generation display device since it represents high quality characteristics such as low power consumption, high luminance, and high response speed.

Recently, a high resolution OLED display is required, but such a high resolution display device has a limitation in increasing the number of pixels within a limited area because an aperture ratio of the pixels deteriorates.

The above information disclosed in this Background section is only for enhancement of understanding of the background of the invention, and does not constitute an admission of the prior art.

SUMMARY

One aspect of the invention provides a high resolution organic light emitting diode (OLED) display that is capable of increasing the number of pixels formed in a limited area and preventing a decrease in an aperture ratio, and a manufacturing method thereof.

Another aspect of the invention provides an organic light emitting diode (OLED) display device, which may comprise: a substrate; first, second and third thin film transistors sequentially laminated over the substrate; a pixel definition layer formed over the substrate and defining a pixel area; and first, second and third organic light emitting diode elements formed over the substrate, sequentially laminated in the pixel area, and respectively connected to the first, second and third thin film transistors.

In the foregoing device, the device may further comprise a first insulating layer formed between the first and second organic light emitting diode elements, and a second insulating layer formed between the second and third organic light emitting diode elements. Each of the first, second and third organic light emitting diode elements may comprise: a first electrode formed over the substrate; a light emission layer formed over the first pixel electrode; and a second electrode formed over the first emission layer, wherein the light emission layer is disposed between the first and second electrodes. The first, second and third thin film transistors may be electrically connected to the first electrodes of the first, second and third organic light emitting diode elements, respectively. The first electrode, the light emission layer and the second electrode may overlap when viewed in a direction perpendicular to a major surface of the substrate. The first electrode, the light emission layer and the second electrode may overlap when viewed in a direction parallel to a major surface of the substrate. The light emission layer may comprise a hole-injection layer, a hole-transporting layer, an organic layer configured to emit light, an electron-transporting layer, and an electron-injection layer which are sequentially laminated.

Still in the foregoing device, the first, second and third organic light emitting diode elements may overlap when viewed in a direction perpendicular to a major surface of the substrate, wherein the device may comprise an array of pixels formed over the substrate, each of the pixels comprising the first, second and third organic light emitting diode elements. The first, second and third organic light emitting diode elements may be configured to emit red colored light, green colored light and blue colored light, respectively. Each of the first, second and third thin film transistors may comprise an active semiconductor layer, a gate electrode and an insulation layer disposed between the active semiconductor layer and the gate electrode, wherein the active semiconductor layer and the gate electrode may overlap when viewed in a direction perpendicular to a major surface of the substrate.

Still another aspect of the invention provides a method of making an OLED display, which comprises: providing a substrate; forming first, second and third thin film transistors sequentially disposed over the substrate; forming a pixel definition layer over the substrate to define a pixel area; forming a first organic light emitting diode element in the pixel area over the substrate; forming a first insulating layer over the first organic light emitting diode element; forming a second organic light emitting diode element over the first insulating layer; forming a second insulating layer over the second organic light emitting diode element; and forming a third organic light emitting diode element over the second insulating layer.

In the foregoing method, the first, second and third organic light emitting diode elements may be connected to first, second and third thin film transistors, respectively. Each of the first, second and third organic light emitting diode elements may comprise: a first electrode formed over the substrate; a light emission layer formed over the first pixel electrode; and a second electrode formed over the first emission layer, wherein the light emission layer is disposed between the first and second electrodes. The first, second and third thin film transistors may be electrically connected to the first electrodes of the first, second and third organic light emitting diode elements, respectively. The first electrode, the light emission layer and the second electrode may overlap when viewed in a direction perpendicular to a major surface of the substrate. The first electrode, the light emission layer and the second electrode may overlap when viewed in a direction parallel to a major surface of the substrate.

Still in the foregoing method, the first, second and third organic light emitting diode elements may overlap when viewed in a direction perpendicular to a major surface of the substrate, wherein the device may comprise an array of pixels over the major surface, each of the pixels comprising the first, second and third organic light emitting diode elements. The second electrodes of the first, second and third organic light emitting diode elements may be electrically connected to one another to form a common electrode. The light emission layer may comprise a hole-injection layer, a hole-transporting layer, an organic emission layer, an electron-transporting layer, and an electron-injection layer that are sequentially stacked. Each of the first, second and third thin film transistors may comprise an active semiconductor layer, a gate electrode and an insulation layer disposed between the active semiconductor layer and the gate electrode, wherein the active semiconductor layer and the gate electrode overlap when viewed in a direction perpendicular to a major surface of the substrate.

An OLED display according to an embodiment includes: a substrate; first to third thin film transistors sequentially laminated on the substrate; a pixel definition layer formed on the substrate and defining a pixel area; and first to third organic light emitting elements formed on the substrate, sequentially laminated in the pixel area, and respectively connected to the first to third thin film transistors.

The OLED display may further include a first insulating layer formed between the first and second organic light emitting elements, and a second insulating layer formed between the second and third organic light emitting elements.

The first organic light emitting element may include: a first pixel electrode formed on the substrate; a first emission layer formed on the first pixel electrode; and a first common electrode formed on the first emission layer.

The first thin film transistor may be electrically connected to the first pixel electrode.

The second organic light emitting element may include: a second pixel electrode formed on the first insulating layer; a second emission layer formed on the second pixel electrode; and a second common electrode formed on the second emission layer.

The second thin film transistor may be electrically connected to the second pixel electrode.

The third organic light emitting element may include: a third pixel electrode formed on the second insulating layer; a third emission layer formed on the third pixel electrode; and a third common electrode formed on the third emission layer.

The third thin film transistor may be electrically connected to the third pixel electrode.

The first to third emission layers may be red, green, and blue emission layers, respectively.

The first to third emission layers may be sequentially laminated with a hole-injection layer, a hole-transporting layer, an organic emission layer, an electron-transporting layer, and an electron-injection layer, respectively.

A manufacturing method of an OLED display according to an embodiment may include: preparing a substrate; sequentially forming first to third thin film transistors on the substrate; forming a pixel definition layer on the substrate to define a pixel area; forming a first organic light emitting element in the pixel area on the substrate; forming a first insulating layer on the first organic light emitting element; forming a second organic light emitting element on the first insulating layer; and forming a second insulating layer on the second organic light emitting element.

The first to third organic light emitting elements may be connected to first to third thin film transistors, respectively.

The first organic light emitting element may include: a first pixel electrode formed on the substrate; a first emission layer formed on the first pixel electrode; and a first common electrode formed on the first emission layer.

The first thin film transistor may be electrically connected to the first pixel electrode.

The second organic light emitting element may include: a second pixel electrode formed on the first insulating layer; a second emission layer formed on the second pixel electrode; and a second common electrode formed on the second emission layer.

The second thin film transistor may be electrically connected to the second pixel electrode.

The third organic light emitting element may include: a third pixel electrode formed on the second insulating layer; a third emission layer formed on the third pixel electrode; and a third common electrode formed on the third emission layer.

The third thin film transistor may be electrically connected to the third pixel electrode.

The first to third emission layers may be sequentially laminated with a hole-injection layer, a hole-transporting layer, an organic emission layer, an electron-transporting layer, and an electron-injection layer, respectively.

According to the OLED display and a manufacturing method thereof described above, not only can the number of pixels formed in the limited area of the OLED display be increased, but the decrease in an aperture ratio can be prevented.

DETAILED DESCRIPTION OF EMBODIMENTS

Embodiments of the present invention will be described more fully hereinafter with reference to the accompanying drawings, in which embodiments of the invention are shown.

As those skilled in the art would realize, the described embodiments may be modified in various different ways, all without departing from the spirit or scope of the present invention.

On the contrary, embodiments introduced herein are provided to make disclosed contents thorough and complete and to sufficiently transfer the spirit to those skilled in the art.

In the drawings, the thickness of layers and regions may be exaggerated for clarity.

In addition, when a layer is described to be formed "on" another layer or substrate, this means that the layer may be formed directly on the other layer or substrate, or a third layer may be interposed between the layer and the other layer or the substrate.

Like reference numerals designate like elements throughout the specification.

An organic light emitting diode (OLED) display according to an embodiment will now be described with reference to FIGS. 2 and 3.

Figure 2:
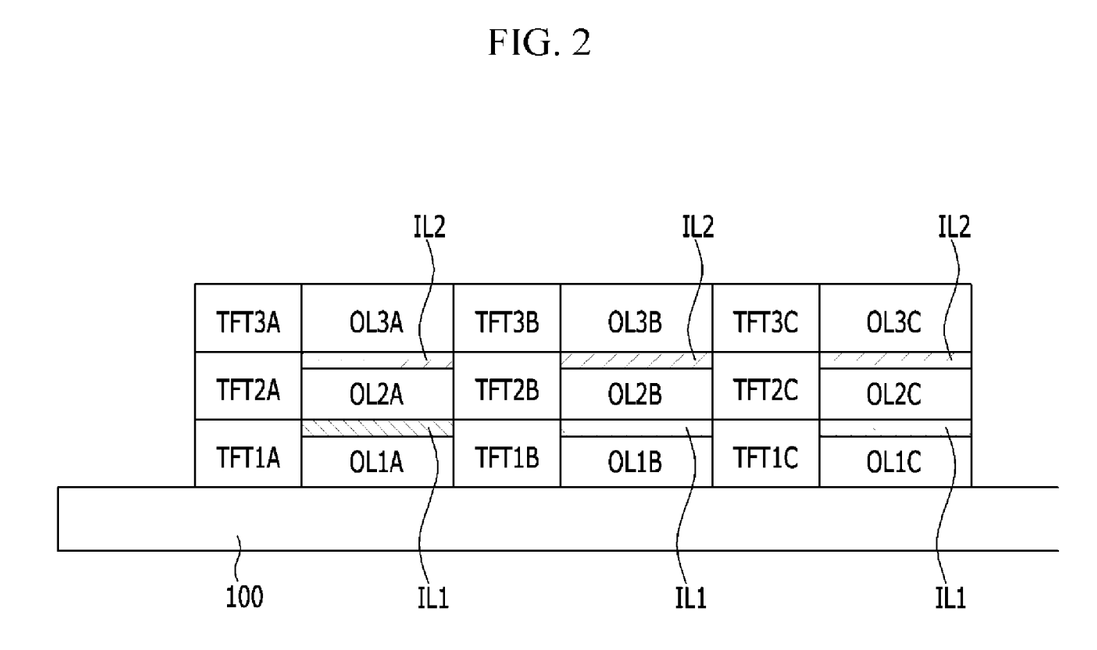
FIG. 2 is a schematic diagram of an OLED display according to an embodiment of the present invention.
Figure 3:
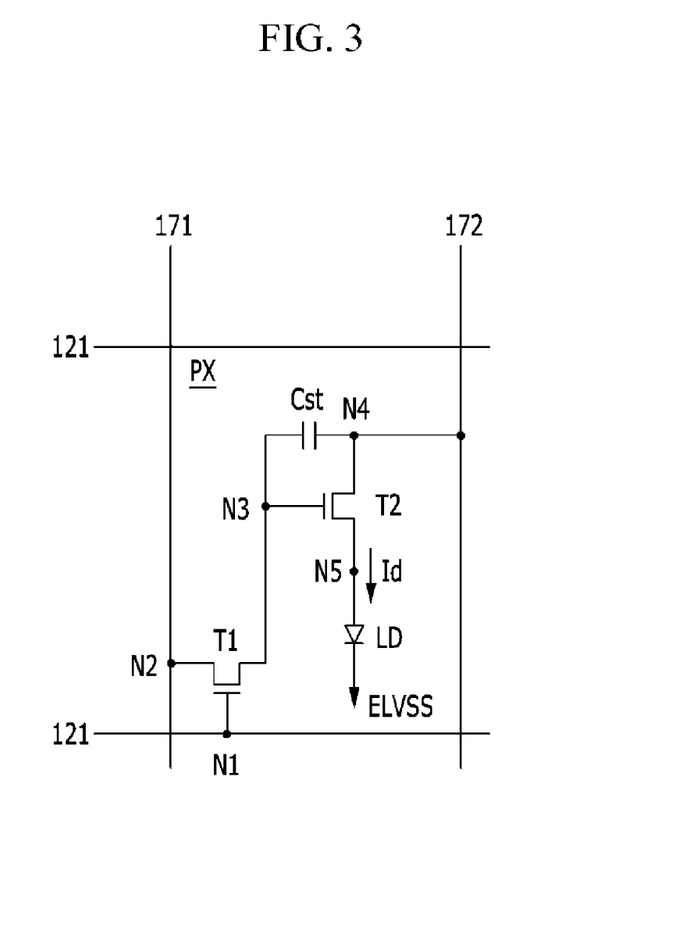
FIG. 3 is an equivalent circuit diagram of one pixel of the OLED display according to the embodiment of the present invention.

FIG. 2 is a schematic diagram of an OLED display according to an embodiment of the present invention, and FIG. 3 is an equivalent circuit diagram of one pixel of the OLED display according to the embodiment of the present invention.

Referring to FIG. 2, in the OLED display according to the embodiment of the present invention, first, second and third organic light emitting elements OL1, OL2, and OL3 are sequentially laminated on a substrate 100.

In this case, the first, second and third organic light emitting elements OL1, OL2, and OL3 may be disposed to overlap.

In addition, first, second and third thin film transistors TFT1, TFT2, and TFT3 are sequentially laminated to be connected to the first, second and third organic light emitting elements OL1, OL2, and OL3, respectively.

In addition, the first, second and third thin film transistors TFT1, TFT2, and TFT3 may be disposed to overlap.

In the OLED display, one pixel consists of a plurality of subpixels.

For example, one pixel may include a red subpixel, a green subpixel, and a blue subpixel, which may emit red colored light, green colored light and blue colored right.

According to the embodiment of the present invention, the first, second and third organic light emitting elements OL1, OL2, and OL3 corresponding to the plurality of subpixels may be sequentially laminated and disposed.

In embodiments, as shown in FIG. 2, the first, second and third organic light emitting elements OL1, OL2, and OL3 may be disposed to overlap each other.

Figure 1:
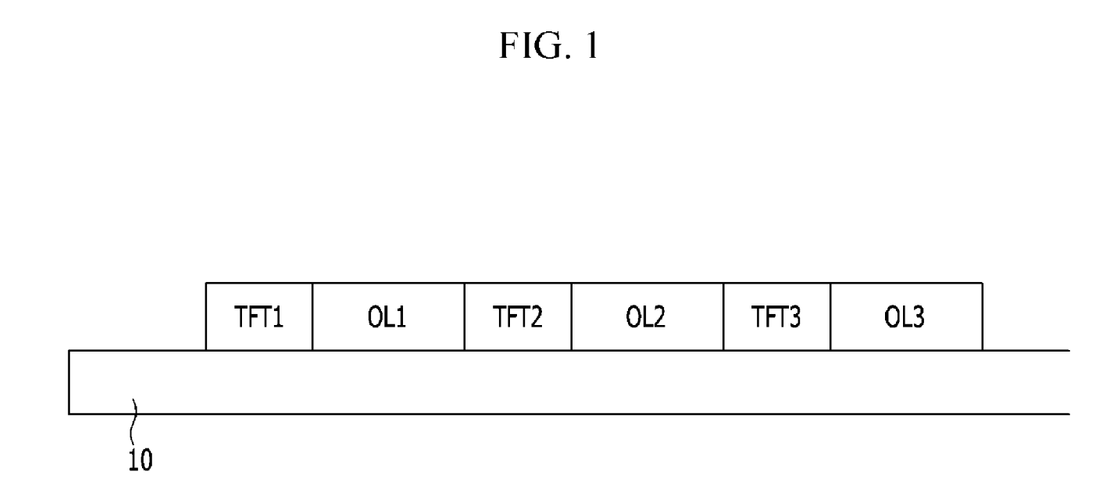
FIG. 1 is a schematic diagram of an organic light emitting diode (OLED) display.

In a typical OLED display, the plurality of subpixels included in one pixel are disposed in a horizontal plane without overlapping each other.

For example, as shown in FIG. 1, a red subpixel OL1, a green subpixel OL2, and a blue subpixel OL3 are disposed in the same horizontal plane.

In addition, the red, green, and blue subpixels OL1, OL2, and OL3 may be connected to and controlled by the individual thin film transistors TFT1, TFT2, and TFT3, respectively.

In this typical arrangement, the thin film transistors TFT1, TFT2, and TFT3 are disposed in the horizontal direction.

According to the embodiment of the present invention, the first, second and third organic light emitting elements OL1, OL2, and OL3 may be sequentially laminated and disposed, as described above.

In addition, the first, second and third thin film transistors TFT1, TFT2, and TFT3 may be sequentially laminated and disposed to be connected to the first, second and third organic light emitting elements OL1, OL2, and OL3, respectively.

Compared with the typical OLED display, the number of pixels that can be formed in a single region increases or the area of each sub-pixel increases.

According to the embodiment of the present invention, three times the number of pixels of the typical OLED display can be formed in the single area.

Accordingly, a high-resolution display device may be implemented through the OLED display according to the embodiment of the present invention.

Meanwhile, according to the embodiment of the present invention, first and second insulating layers IL1 and IL2 may be disposed between the first, and second organic light emitting elements OL1 and OL2, and between the second and third organic light emitting elements OL2 and OL3, respectively.

The first and second insulating layers IL1 and IL2 are disposed between the respective organic light emitting elements OL1, OL2, and OL3 to prevent the organic light emitting elements OL1, OL2, and OL3 from being short-circuited.

More specifically, the first insulating layer IL1 may be formed between the first organic light emitting element OL1 and the second organic light emitting element OL2.

The second insulating layer IL2 may be formed between the second organic light emitting element OL2 and the third organic light emitting element OL3.

In this case, the first and second insulating layers IL1 and IL2 may be formed of an organic or inorganic insulating material.

In this case, the first organic light emitting element OL1 includes a first pixel electrode, a first light emission layer, and a first common electrode.

The first pixel electrode may be formed of a transparent conductive material such as indium tin oxide (ITO), indium zinc oxide (IZO), zinc oxide (ZnO), indium oxide ($In_2O_3$), etc., or a reflective metal such as lithium, calcium, lithium fluoride/calcium, lithium fluoride/aluminum, aluminum, silver, magnesium, gold, etc.

In this case, the first pixel electrode may be electrically connected to a driving drain electrode of the aforementioned first thin film transistor TFT1 and the like.

The first emission layer may be formed on the first pixel electrode.

The first emission layer may include a red organic emission layer for emitting red light, a green organic emission layer for emitting green light, and a blue organic emission layer for emitting blue light. The red, green, and blue organic emission layers realize color images of red, green, and blue, respectively.

In the first embodiment of the present invention, the first emission layer may be the red organic emission layer.

More specifically, the first emission layer is formed as multiple layers including one or more of the emission layer, a hole-injection layer (HIL), a hole-transporting layer (HTL), an electron-transporting layer (ETL), and an electron-injection layer (EIL).

According to the embodiment of the present invention, the first emission layer may include all of them, and the HIL, the HTL, the organic emission layer, the ETL, and the EIL may be sequentially laminated on the first pixel electrode.

In addition, the first common electrode may be formed on the first emission layer.

The first common electrode may be formed of a transparent conductive material such as indium tin oxide (ITO), indium zinc oxide (IZO), zinc oxide (ZnO), indium oxide ($In_2O_3$), etc.

Meanwhile, the second organic light emitting element OL2 may be formed on the first organic light emitting element OL1.

As described above, the first insulating layer IL1 is positioned between the first and second organic light emitting elements OL1 and OL2.

The second organic light emitting element OL2 includes a second pixel electrode, a second light emission layer, and a second common electrode.

The second pixel electrode may be formed on the aforementioned first insulating layer IL1.

The second pixel electrode may be formed of a transparent conductive material such as indium tin oxide (ITO), indium zinc oxide (IZO), zinc oxide (ZnO), indium oxide ($In_2O_3$), etc.

Since the second pixel electrode is formed of the transparent conductive material, light emitted from the first organic light emitting element OL1 therebelow may be transmitted through the second organic light emitting element OL2.

In this case, the second pixel electrode may be electrically connected to a driving drain electrode of the aforementioned second thin film transistor TFT2 and the like.

The second emission layer may be formed on the second pixel electrode.

The second emission layer may include a red organic emission layer for emitting red light, a green organic emission layer for emitting green light, and a blue organic emission layer for emitting blue light. The red, green, and blue organic emission layers realize color images of red, green, and blue, respectively.

In the first embodiment of the present invention, the second emission layer may be the green organic emission layer.

More specifically, the second emission layer is formed as multiple layers including one or more of the emission layer, a hole-injection layer (HIL), a hole-transporting layer (HTL), an electron-transporting layer (ETL), and an electron-injection layer.

According to the embodiment of the present invention, the second emission layer may include all of them, and the HIL, the HTL, the organic emission layer, the ETL, and the EIL may be sequentially laminated on the second pixel electrode.

In addition, the second common electrode may be formed on the second emission layer.

The second common electrode may be formed of a transparent conductive material such as indium tin oxide (ITO), indium zinc oxide (IZO), zinc oxide (ZnO), indium oxide ($In_2O_3$), etc.

The third organic light emitting element OL3 may be formed on the second organic light emitting element OL2.

As described above, the second insulating layer IL2 is positioned between the second and third organic light emitting elements OL2 and OL3.

The third organic light emitting element OL3 includes a third pixel electrode, a third emission layer, and a third common electrode.

The third pixel electrode may be formed on the aforementioned second insulating layer IL2.

The third pixel electrode may be formed of a transparent conductive material such as indium tin oxide (ITO), indium zinc oxide (IZO), zinc oxide (ZnO), indium oxide ($In_2O_3$), etc.

Since the third pixel electrode is formed of the transparent conductive material, light emitted from the first and second organic light emitting elements OL1 and OL2 therebelow may be transmitted through the third organic light emitting element OL3.

In this case, the third pixel electrode may be electrically connected to a driving drain electrode of the aforementioned third thin film transistor TFT3 and the like.

The third emission layer may be formed on the third pixel electrode.

The third emission layer may include a red organic emission layer for emitting red light, a green organic emission layer for emitting green light, and a blue organic emission layer for emitting blue light. The red, green, and blue organic emission layers realize color images of red, green, and blue, respectively.

In the first embodiment of the present invention, the third emission layer may be the blue organic emission layer.

More specifically, the third emission layer is formed as multiple layers including one or more of the emission layer, a hole-injection layer (HIL), a hole-transporting layer (HTL), an electron-transporting layer (ETL), and an electron-injection layer.

According to the embodiment of the present invention, the third emission layer may include all of them, and the HIL, the HTL, the organic emission layer, the ETL, and the EIL may be sequentially laminated on the third pixel electrode.

In addition, the third common electrode may be formed on the third emission layer.

The third common electrode may be formed of a transparent conductive material such as indium tin oxide (ITO), indium zinc oxide (IZO), zinc oxide (ZnO), indium oxide ($In_2O_3$), etc. In embodiments, the first, second and third common electrodes may be connected to one another for providing a common electrode.

Meanwhile, according to the embodiment of the present invention, the first, second and third thin film transistors TFT1, TFT2, and TFT3 may be sequentially laminated.

In the illustrated embodiment, the second thin film transistor TFT2 is positioned on the first thin film transistor TFT1, and the third thin film transistor TFT3 is positioned on the second thin film transistor TFT2.

As described above, the first, second and third thin film transistors TFT1, TFT2, and TFT3 are sequentially laminated, thereby increasing the number of pixels to be formed in the single region or area.

According to the embodiment of the present invention, three times the number of pixels of the typical OLED display can be formed in the single area.

Accordingly, a high-resolution display device may be implemented through the OLED display according to the embodiment of the present invention.

In this case, the first, second and third thin film transistors TFT1, TFT2, and TFT3 may include a switching transistor and a driving transistor, respectively.

However, the first, second and third thin film transistors TFT1, TFT2, and TFT3 may further include an additional transistor in addition to the two thin film transistors.

FIG. 3 is an equivalent circuit diagram of one pixel of the OLED display according to the embodiment of the present invention.

Referring to FIG. 3, the equivalent circuit diagram of the single subpixel formed on the substrate 100 will now be described.

For example, the first organic light emitting element OL1 driven by the first thin film transistor TFT1 will be described.

The OLED display includes a plurality of signal lines 121, 171, and 172, and subpixels connected thereto.

In this case, the subpixels may be any one of a red pixel R emitting red colored light, a green pixel G emitting green colored light, and a blue pixel B emitting blue colored light.

The signal lines include gate lines 121 for transmitting a scanning signal, data lines 171 for transmitting a data signal, a driving voltage line 172 for transmitting a driving voltage, and the like.

The gate lines 121 substantially extend in a row direction and are nearly parallel to each other, while the data lines 171 substantially extend in a column direction and are nearly parallel to each other.

The driving voltage lines 172 are illustrated to substantially extend in the column direction, but they may extend in the row or column direction or have a net-like shape.

In this case, the single subpixel includes a thin film transistor including a switching transistor T1 and a driving transistor T2, a storage capacitor Cst, and an organic light emitting element LD.

In embodiments, one pixel PX may further include a thin film transistor and a capacitor to compensate a current that is supplied to the organic light emitting element LD.

The switching transistor T1 includes a control terminal N1, an input terminal N2, and an output terminal N3.

In this case, the control terminal N1 is connected to the gate line 121, the input terminal N2 is connected to the data line 171, and the output terminal N3 is connected to the driving transistor T2.

The switching transistor T1 transmits the data signal transmitted via the data line 171 to the driving transistor T2 in response to the scanning signal transmitted via the gate line 121.

The driving transistor T2 also includes a control terminal N3, an input terminal N4, and an output terminal N5.

In this case, the control terminal N3 is connected to the switching transistor T1, the input terminal N4 is connected to the driving voltage line 172, and the output terminal N5 is connected to the organic light emitting element LD.

The driving transistor T2 outputs an output current Id, an amount of which varies according to a voltage applied between the control terminal N3 and the output terminal N5.

In this case, the capacitor Cst is connected between the control terminal N3 and the input terminal N4 of the driving transistor T2.

The capacitor Cst is charged with a data signal applied to the control terminal N3 of the driving transistor T2, and maintains the data signal even after the switching transistor T1 is turned off.

For example, as an organic light emitting diode (OLED), the organic light emitting element LD has an anode connected to the output terminal N5 of the driving transistor T2 and a cathode connected to a common voltage Vss.

The organic light emitting element LD displays an image by emitting light of varying intensities according to the output current Id of the driving transistor T2.

The organic light emitting element LD may contain an organic material that represents one or more of primary colors including three of those such as red, green, and blue, and the OLED display displays a desired image with a spatial sum of these colors.

The switching transistor T1 and the driving transistor T2 are n-channel electric effect transistors (FETs), but at least one of them may be a p-channel FET.

In addition, a connection relationship between the transistors T1 and T2, the capacitor Cst, and the organic light emitting element LD may be changed.

A manufacturing method of an OLED display according to an embodiment will now be described.

When describing the manufacturing method of the OLED display according to the embodiment of the present invention, a detailed description of the same components as those of the aforementioned OLED display will be omitted.

FIGS. 4 to 8 are drawings sequentially illustrating a manufacturing process of the OLED display according to the embodiment of the present invention.

Figure 4:
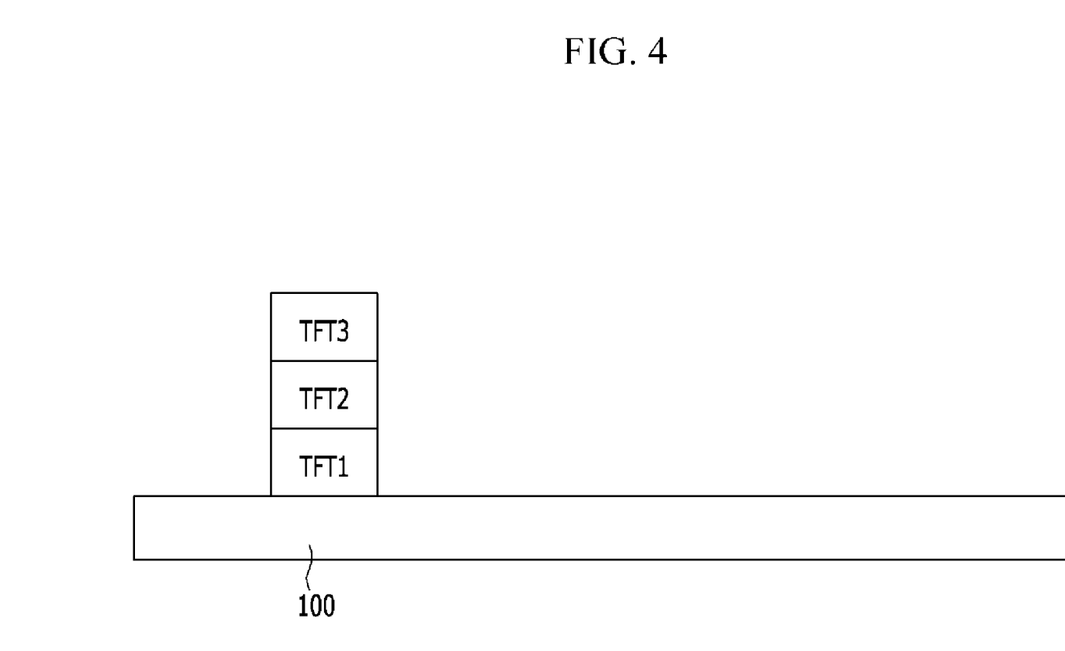
FIGS. 4 to 8 are drawings sequentially illustrating a manufacturing process of an OLED display according to an embodiment of the present invention.

First, referring to FIG. 4, first, second and third thin film transistors TFT1, TFT2, and TFT3 are sequentially laminated on one region of a substrate 100.

In the illustrated embodiments, the second thin film transistor TFT2 is laminated on the first thin film transistor TFT1, and the third thin film transistor TFT3 is laminated on the second thin film transistor TFT2.

As described above, the first, second and third thin film transistors TFT1, TFT2, and TFT3 may include, for example, a switching transistor and a driving transistor, respectively.

However, the first, second and third thin film transistors TFT1, TFT2, and TFT3 may further include an additional transistor in addition to the two thin film transistors.

Figure 5:
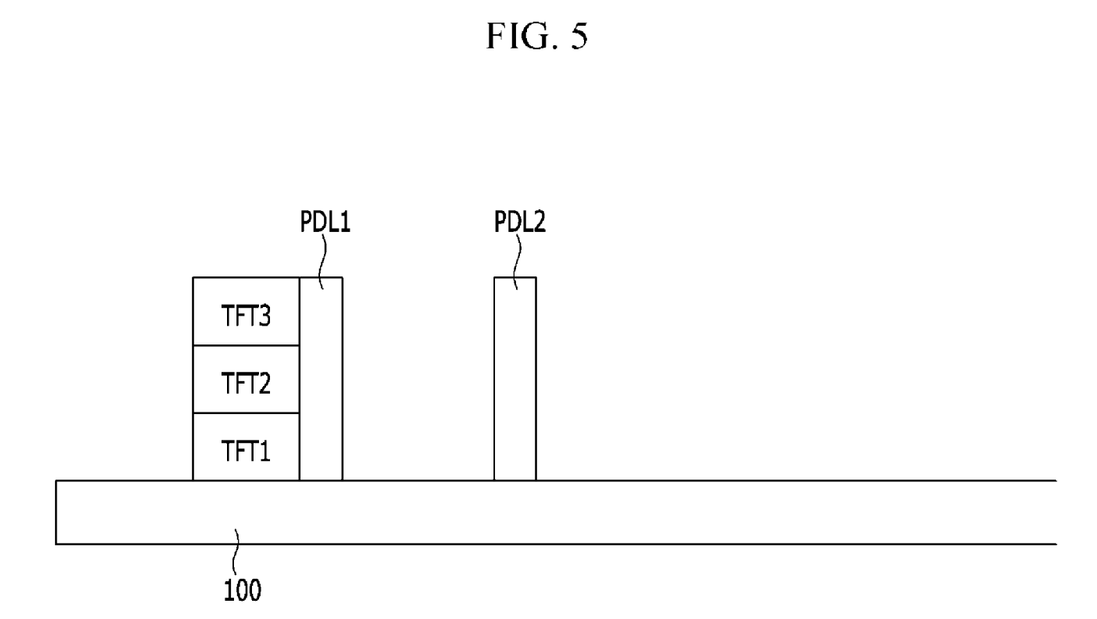

Next, pixel definition layers PDL1 and PDL2 are formed on the substrate 100 to define a pixel area.

The pixel definition layers PDL1 and PDL2 represent the region where one pixel can be formed, and the first, second and third organic light emitting elements OL1, OL2, and OL3 may be positioned in the pixel definition layers PDL1 and PDL2.

In addition, the first organic light emitting element OL1 is formed in the pixel definition layers PDL1 and PDL2.

The first organic light emitting element OL1 may be connected to the first thin film transistor TFT1.

The first organic light emitting element OL1 may be formed by sequentially laminating a first pixel electrode, a first emission layer, and a first common electrode.

In this case, the first emission layer formed on the first pixel electrode may be formed by sequentially laminating a hole injection layer, a hole-transporting layer, an organic emission layer, an electron-transporting layer, and an electron-injection layer.

According to the first embodiment of the present invention, an organic emission layer of the first emission layer may be the red emission layer.

Figure 6:
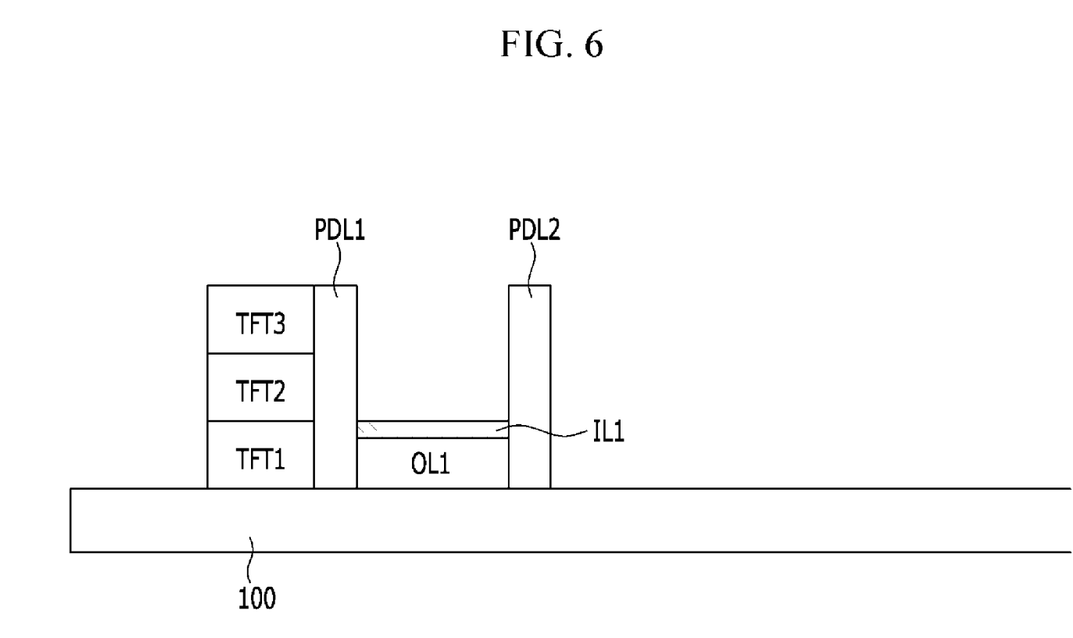

Next, a first insulating layer IL1 is formed on the first organic light emitting element OL1.

The first insulating layer IL1 may prevent the first organic light emitting element OL1 and a second organic light emitting element OL2 thereabove from being short-circuited to each other.

After forming the first insulating layer IL1, a second organic light emitting element OL2 is formed on the first insulating layer IL1.

The second organic light emitting element OL2 may be connected to the second thin film transistor TFT2.

Similar to the first organic light emitting element OL1, the second organic light emitting element OL2 may be formed by sequentially laminating a second pixel electrode, a second light emission layer, and a second common electrode.

In this case, the second emission layer formed on the second pixel electrode may be formed by sequentially laminating a hole-injection layer, a hole-transporting layer, an organic emission layer, an electron-transporting layer, and an electron-injection layer.

According to the first embodiment of the present invention, an organic emission layer of the second emission layer may be the green emission layer.

Figure 7:
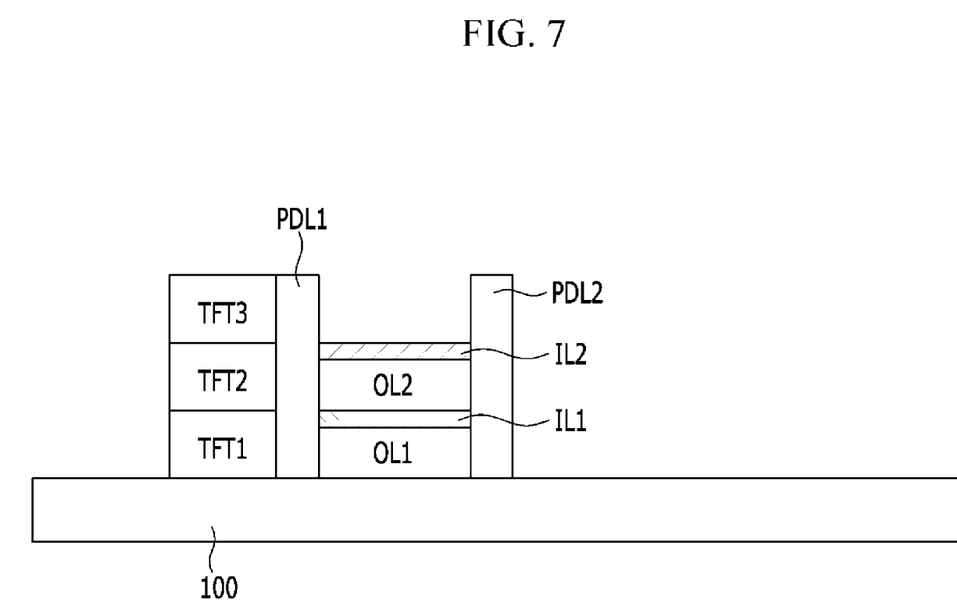

Next, a first insulating layer IL2 is formed on the second organic light emitting element OL2.

The second insulating layer IL2 may prevent the second organic light emitting element OL2 and a third organic light emitting element OL3 thereabove from being short-circuited to each other.

Figure 8:
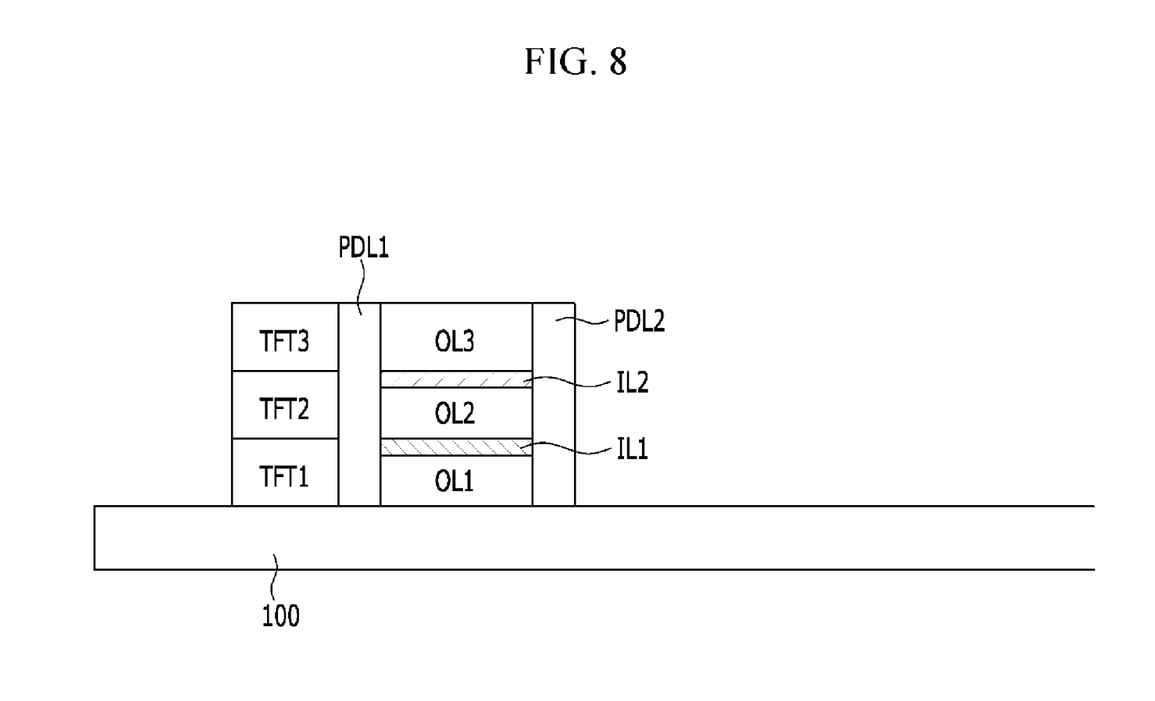

After forming the second insulating layer IL2, the third organic light emitting element OL3 is formed on the second insulating layer IL2.

The third organic light emitting element OL3 may be connected to the third thin film transistor TFT3.

Similar to the first organic light emitting element OL1, the third organic light emitting element OL3 may be formed by sequentially laminating a third pixel electrode, a third light emission layer, and a third common electrode.

In this case, the third emission layer formed on the third pixel electrode may be formed by sequentially laminating a hole-injection layer, a hole-transporting layer, an organic emission layer, an electron-transporting layer, and an electron-injection layer.

According to the first embodiment of the present invention, an organic emission layer of the third emission layer may be the blue emission layer.

According to the embodiment of the present invention, the OLED display where three times the number of pixels of the typical OLED display is formed in the single area can be manufactured.

Accordingly, the high-resolution display device can be realized.

While embodiments of this invention have been described, it is to be understood that the invention is not limited to the disclosed embodiments, but, on the contrary, is intended to cover various modifications and equivalent arrangements included within the spirit and scope of the appended claims.

What is claimed is:

1. An organic light emitting diode (OLED) display device comprising:
   a substrate;
   first, second and third thin film transistors sequentially laminated over the substrate;
   a pixel definition layer formed over the substrate and defining a pixel area; and
   first, second and third organic light emitting diode elements formed over the substrate, sequentially laminated in the pixel area, and respectively connected to the first, second and third thin film transistors, wherein the first, second and third organic light emitting diode elements overlap in the depth dimension of the OLED display device.

2. The device of claim 1, wherein each of the first, second and third organic light emitting diode elements comprises:
   a first electrode formed over the substrate;
   a light emission layer formed over the first electrode; and
   a second electrode formed over the light emission layer, wherein the light emission layer is disposed between the first and second electrodes.

3. The device of claim 2, wherein the first, second and third thin film transistors are electrically connected to the first electrodes of the first, second and third organic light emitting diode elements, respectively.

4. The device of claim 2, wherein the first electrode, the light emission layer and the second electrode overlap in the depth dimension of the OLED display device.

5. The device of claim 2, wherein the first electrode, the light emission layer and the second electrode overlap in a direction parallel to the depth dimension of the OLED display device.

6. The device of claim 2, wherein the light emission layer comprises a hole-injection layer, a hole-transporting layer, an organic layer configured to emit light, an electron-transporting layer, and an electron-injection layer are sequentially laminated.

7. The device of claim 1, wherein the device comprises an array of pixels formed over the substrate, each of the pixels comprising the first, second and third organic light emitting diode elements.

8. The device of claim 1, wherein the first, second and third organic light emitting diode elements are configured to emit red colored light, green colored light and blue colored light, respectively.

9. The device of claim 1, wherein each of the first, second and third thin film transistors comprises an active semiconductor layer, a gate electrode and an insulation layer disposed between the active semiconductor layer and the gate electrode, and wherein the active semiconductor layer and the gate electrode overlap in the depth dimension of the OLED display device.

10. The device of claim 1, wherein the first, second and third thin film transistors overlap in the depth dimension of the OLED display device.

11. An organic light emitting diode (OLED) display device comprising:
    a substrate;
    first, second and third thin film transistors sequentially laminated over the substrate;
    a pixel definition layer formed over the substrate and defining a pixel area; and
    first, second and third organic light emitting diode elements formed over the substrate, sequentially laminated in the pixel area, and respectively connected to the first, second and third thin film transistors; and
    a first insulating layer formed between the first and second organic light emitting diode elements, and a second insulating layer formed between the second and third organic light emitting diode elements.

12. A method of making an OLED display, the method comprising:
    providing a substrate;
    forming first, second and third thin film transistors sequentially disposed over the substrate;
    forming a pixel definition layer over the substrate to define a pixel area;
    forming a first organic light emitting diode element in the pixel area over the substrate;
    forming a first insulating layer over the first organic light emitting diode element;
    forming a second organic light emitting diode element over the first insulating layer;
    forming a second insulating layer over the second organic light emitting diode element; and
    forming a third organic light emitting diode element over the second insulating layer.

13. The method of claim 12, wherein the first, second and third organic light emitting diode elements are connected to first, second and third thin film transistors, respectively.

14. The method of claim 12, wherein each of the first, second and third organic light emitting diode elements comprises:
    a first electrode formed over the substrate;
    a light emission layer formed over the pixel electrode; and
    a second electrode formed over the light emission layer, wherein the light emission layer is disposed between the first and second electrodes.

15. The method of claim 14, wherein the first, second and third thin film transistors are electrically connected to the first electrodes of the first, second and third organic light emitting diode elements, respectively.

16. The method of claim 14, wherein the first electrode, the light emission layer and the second electrode overlap in the depth dimension of the OLED display.

17. The method of claim 14, wherein the first electrode, the light emission layer and the second electrode overlap in a direction parallel to the depth dimension of the OLED display.

18. The method of claim 14, wherein the first, second and third organic light emitting diode elements overlap in the depth dimension of the OLED display, wherein the device comprises an array of pixels over the substrate, each of the pixels comprising the first, second and third organic light emitting diode elements.

19. The method of claim 14, wherein the second electrodes of the first, second and third organic light emitting diode elements are electrically connected to one another to form a common electrode.

20. The method of claim 14, wherein the light emission layer comprises a hole-injection layer, a hole-transporting layer, an organic emission layer, an electron-transporting layer, and an electron-injection layer that are sequentially stacked.

21. The method of claim 12, wherein each of the first, second and third thin film transistors comprises an active semiconductor layer, a gate electrode and an insulation layer disposed between the active semiconductor layer and the gate electrode, wherein the active semiconductor layer and the gate electrode overlap in the depth dimension of the OLED display.

* * * * *